US008320585B2

(12) United States Patent
Gruenhagen et al.

(10) Patent No.: US 8,320,585 B2
(45) Date of Patent: Nov. 27, 2012

(54) RADIO WITH DUAL SIDED AUDIO

(75) Inventors: Deborah A. Gruenhagen, Southwest Ranches, FL (US); Javier Alfaro, Miami, FL (US); Karl F. Mueller, Sunrise, FL (US); David M. Yeager, Boca Raton, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1245 days.

(21) Appl. No.: 11/672,630

(22) Filed: Feb. 8, 2007

(65) Prior Publication Data

US 2008/0192977 A1 Aug. 14, 2008

(51) Int. Cl.
*H03G 5/00* (2006.01)

(52) U.S. Cl. .............. 381/98; 381/66; 381/96; 381/104; 381/123; 379/406.01

(58) Field of Classification Search ................. 381/94.7, 381/92, 66, 334, 335, 96, 97, 98, 101, 102, 381/103, 104, 106, 107, 109, 110, 120, 121, 381/123; 379/406.01, 406.04, 406.06, 406.08, 379/406.09, 406.05, 406.02; 455/63.1, 62, 455/71, 75, 113, 119, 135, 136, 139, 150.1, 455/164.1, 173.1, 182.1, 192.1, 216, 222, 455/227, 313, 316
See application file for complete search history.

(56) References Cited

U.S. PATENT DOCUMENTS 4,284,844 A 8/1981 Belles
5,673,314 A * 9/1997 Olkoski et al. ........... 379/433.13
5,884,156 A * 3/1999 Gordon ......................... 455/321
6,175,489 B1 * 1/2001 Markow et al. .......... 361/679.23
6,324,284 B1 11/2001 Hawker et al.
2003/0000767 A1 1/2003 Manrique
2004/0203510 A1 * 10/2004 Claxton et al. ............... 455/90.3
2006/0128321 A1 * 6/2006 Bae ................................ 455/73

FOREIGN PATENT DOCUMENTS

EP 1560400 B1 12/2009
JP 04318799 11/1992
JP 2004032686 1/2004
JP 2004032686 A * 1/2004
WO 9736458 10/1997

OTHER PUBLICATIONS

PCT/US2008/051887—International Search Report—Written Opinion mailed Jun. 23 2008—11 pages.

(Continued)

*Primary Examiner* — Vivian Chin
*Assistant Examiner* — Leshui Zhang
(74) *Attorney, Agent, or Firm* — Barbara R. Doutre

(57) ABSTRACT

A dual-sided radio (100) for enhancing a user's experience is provided. The radio includes a primary transducer (110) on an audio-side of the radio that projects a primary sound, a secondary transducer (120) on a data-side of the radio that projects a mid-high frequency sound, a processor (160) that equalizes (200) audio to the primary transducer and the secondary transducer, and a communication module (130) that receives and transmits communication signals containing the audio. The secondary transducer supplements the primary sound with a mid-high frequency sound (404) to compensate for mid-high frequency loss of the primary sound due to diffraction (300).

27 Claims, 7 Drawing Sheets

OTHER PUBLICATIONS

PCT/US2008/051887—International Preliminary Report, issued Aug. 11, 2009—8 pages.

Russian Application No. 2009133476128(047090)—Translation—Office Action of Dec. 20, 2010—6 pages.

Australian Application No. 2008214166—Office Action of May 14, 2010.

Australia Office Action for counterpart Application No. 2008214166 mailed on Jun. 16, 2011.

Canada Office Action for counterpart Application No. 2677357 mailed on Dec. 1, 2011.

English language translation of Russia Office Action for counterpart Application No. 2009133476 mailed on Oct. 13, 2010, no translation provided with application.

Australia Office Action for counterpart Application No. 2008214166, mailed Jun. 16, 2011.

Canada Office Action for counterpart Application No. 2677357, mailed Dec. 1, 2011.

English language translation of Russia Office Action for counterpart Application No. 2009133476, mailed Oct. 13, 2010.

E.M. Saad et al—"A Multifeature Speech/Music Discrimination System"—Nineteenth National Radio Science Conference, Alexandria—Mar. 2002—pp. 208-213.

Joe Wolfe—Speech and Music, Acoustics and Coding, and What Music Might Be 'For'—Proceedings of the 7th International Conference of Music Perception and Cognition, Sydney—2002 ISBN 1-876346-36-6—pp. 10-13.

Canadian Office Action for counterpart Application 2677357, mailed Aug. 1, 2012.

Australia Application No. 2008214166—Notice of Acceptance, mailed Jan. 20, 2012.

Australian Letters Patent No. 2008216166 dated May 17, 2012.

* cited by examiner

RADIO WITH DUAL SIDED AUDIO

FIELD OF THE INVENTION

This invention relates generally to mobile communication devices, and more particularly to transducer arrangement designs.

BACKGROUND OF THE INVENTION

The hand-held radio industry is constantly challenged in the market place for high audio quality mobile devices. A high audio quality product is characterized as producing crisp sound at a sufficiently high volume. Fleet service workforces generally demand high audio quality radios having speaker-phone capabilities. In a high-audio speakerphone radio, a high audio speaker can project sound out of the speakerphone to the user. A high audio speaker generally replaces the function of the earpiece that is normally positioned against the user's ear. The high audio speakerphones allow a user to engage in a voice conversation without having to hold the radio to the ear.

The fleet service workforces generally work in adverse environments where noise can degrade the quality of the listening experience. That is, when combined with noise, the projected audio is not as clear to the user. The audio may sound muffled due to the addition of the unwanted noise. Moreover, with the demand to make products smaller and with more features, the size of the radios and the speakers are reduced. Furthermore, the display and keypad generally occupy a large surface area on the radio. Consequently, there is little room to place a high audio speaker except generally on a back side of the phone. In such regard, during use, a user that is exposed to the front side of the radio while viewing the display or interfacing with the keypad will not receive audio directly from the speaker on the back side. The sound must travel around the radio for the user to hear, which can affect the quality of the sound. This leads to a degradation in audio quality since some portions of the sound signal are suppressed.

SUMMARY OF THE INVENTION

One embodiment of the invention is a dual-sided radio. The dual-sided radio can include an audio-side having a primary transducer that projects a primary sound in a front direction, and a data-centric side having a secondary transducer that projects mid-high frequency sound in a back direction. The secondary transducer compensates for mid-high frequencies that are not diffracted around the dual-sided radio from the primary transducer. The secondary transducer provides better sound quality and intelligibility for voice communication while the user is engaged in data mode and holding the device with the display towards the user and the primary transducer directed away from the user. The enhanced intelligibility from the secondary transducer makes it so that the user does not have to keep flipping the device around between the audio side and data side to hear the voice communication while in engaged in a data task. The dual-sided radio can include a processor that provides audio to the primary transducer and the secondary transducer; and a communication module that receives and transmits communication signals containing the audio.

The data-centric side includes a key-pad or touch-sensitive display operatively coupled to the communication module for entering data, and a display operatively coupled to the communication module for presenting visual information. The audio-side is approximately opposite to the data-centric side. The secondary transducer can be positioned peripheral to the display and the key-pad. The processor can filter audio to the primary transducer and the secondary transducer. In one aspect, the processor can high-pass filter the audio to the secondary transducer to balance an equalization of the sound at the data-centric side. In another aspect, the processor can adjust a volume of the secondary transducer as a function of a primary volume of the primary transducer. In one configuration, the processor can turn off the secondary speaker when the primary transducer is in high-volume mode.

In another arrangement, the processor can determine a use-mode. The processor can adjust a primary volume of the primary transducer and a secondary volume of the secondary transducer based on the use-mode. In one arrangement, the processor can turn off the primary transducer and turn on the secondary speaker when the dual-sided radio is used in whisper mode, or private mode. In another arrangement, the processor can determine when the data-centric side is used, and turn on the secondary speaker. In one aspect, the processor can adjust an equalization of the primary transducer based on a sound quality of the primary sound in the second direction, or adjust an equalization of the secondary transducer based on a sound quality of the primary sound in the second direction.

DETAILED DESCRIPTION OF THE DRAWINGS

Figure 1:
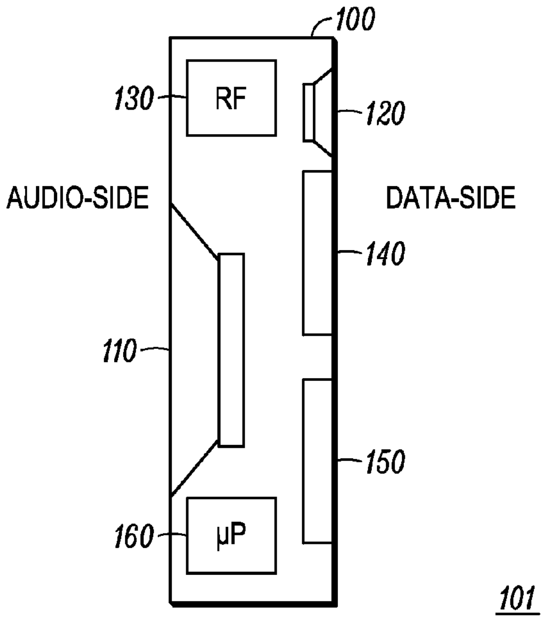
FIG. 1 is a side view of a dual-side radio showing an audio-side and a data-side in accordance with an embodiment of the present invention.

While the specification concludes with claims defining the features of the embodiments of the invention that are regarded as novel, it is believed that the method, system, and other embodiments will be better understood from a consideration of the following description in conjunction with the drawing figures, in which like reference numerals are carried forward.

As required, detailed embodiments of the present method and system are disclosed herein. However, it is to be understood that the disclosed embodiments are merely exemplary, which can be embodied in various forms. Therefore, specific structural and functional details disclosed herein are not to be interpreted as limiting, but merely as a basis for the claims and as a representative basis for teaching one skilled in the art to variously employ the embodiments of the present invention in virtually any appropriately detailed structure. Further, the terms and phrases used herein are not intended to be limiting but rather to provide an understandable description of the embodiment herein.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "suppressing" can be defined as reducing or removing, either partially or completely.

Embodiments of the invention are directed to a dual-sided radio having a primary transducer on an audio-side, and a secondary transducer on a data-side. The secondary transducer enhances an audio quality of the sound generated by the primary transducer. The secondary transducer is significantly smaller than the primary transducer. The secondary transducer generates mid to high frequencies to compensate for mid to high frequency losses due to diffraction. The sound produced by the primary transducer may not diffract to the data-side thus suppressing mid to high frequency components. The secondary transducer directly projects these mid to high frequencies to the data-side.

A processor is included to adjust a volume of the primary speaker and the secondary speaker based on a use-mode. As one example, the processor can turn off the primary transducer and turn on the secondary transducer when the radio is used in a whisper, or private, mode. As another example, the processor can turn on the primary transducer and adjust the volume of the secondary transducer to converse battery live in a power saving mode.

Referring to FIG. 1, a side view 101 of a dual-sided radio 100 is shown in accordance with an embodiment of the invention. The radio 100 can be a two-way radio for dispatch or interconnect communication, a cell phone, a personal digital assistant, a portable media player, or any other suitable communication device. The radio 100 can include a primary transducer 110, a secondary transducer 120, a display 140, and a keypad 150, but is not limited to these. The radio 100 can also include analog-to-digital (A/D) converters, amplifiers, logic circuits, echo detectors, noise suppressors, voice activity detectors or the like for providing audio processing functionality, though not shown. Briefly, the primary transducer 110 can produce a primary sound that travels from the audio-side of the radio 100 and around to a data-side of the radio 100. The secondary transducer 120 supplements the primary sound with mid-high frequency sound to compensate for any mid-high frequency loss due to sound propagation losses associated with the sound traveling from the audio-side to the data-side.

The dual-sided radio 100 can include a communication module 130 operatively coupled to the primary transducer 110 and the secondary transducer 120 for receiving and transmitting communication signals containing audio. The communication module 130 can receive audio packets over a communication link from one or more other mobile devices. The communication module 130 can decode the audio packets and play audio out of the primary transducer 110 and the secondary transducer 120. The dual-sided radio 100 can also include a processor 160 operatively coupled to the communication module 130, the primary transducer 110, and the secondary transducer 120. The processor 160 can adjust a primary volume of the primary transducer 110 and adjust a secondary volume of the secondary transducer 120. As one example, the processor can provide audio to both the primary transducer 110 and secondary transducer 120. The processor 160 can equalize the audio signal to the primary transducer 110 and secondary transducer 120 to enhance a user's audio experience when using the radio.

Figure 2:
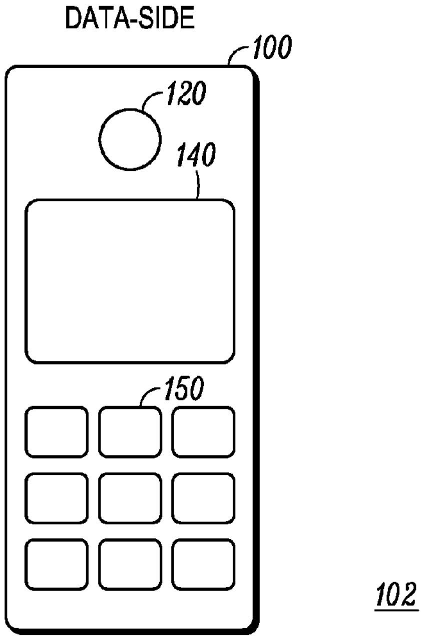
FIG. 2 is a front view of the dual-side radio of FIG. 1 showing the data-side in accordance with an embodiment of the present invention.

Referring to FIG. 2, a front view 102 of the dual-sided radio 100 is shown in accordance with an embodiment of the invention. The front view is also considered a data-centric side 102 since it includes the display 140 and the keypad 150. The data-centric side 102 may also include other user-interface components for allowing a user to operate the radio 100. In such an arrangement, a user can hold the radio 100 in one hand and operate the radio with the other hand. The user can enter data through the keypad 150, or any other suitable input device. The display 140 provides the user with visual feedback that may be entered, or displayed during radio dispatch or interconnect communication. The secondary transducer 120 can be positioned peripheral to the display 140 or the keypad 150 to project secondary sound in a direction of the user. The secondary transducer 120 is significantly smaller than the primary transducer 110 on the audio-side of the radio 100. This is necessary since the amount of space available on the data-side is limited. Notably, there is little surface area for a large speaker in addition to a keypad and display. Accordingly, a smaller secondary transducer 120 is provided on the data-side. The larger primary transducer 110 is positioned on the audio-side (e.g. back-side) since there is more surface area available. Moreover, since only the higher frequencies of the primary transducer 110 on the audio-side are suppressed, the secondary transducer 120 on the data-side supplements the low frequencies produced by the primary transducer 110 with high frequencies. In particular, the secondary transducer 120 generates mid to high frequencies and does not require a large magnet or diaphragm.

Figure 3:
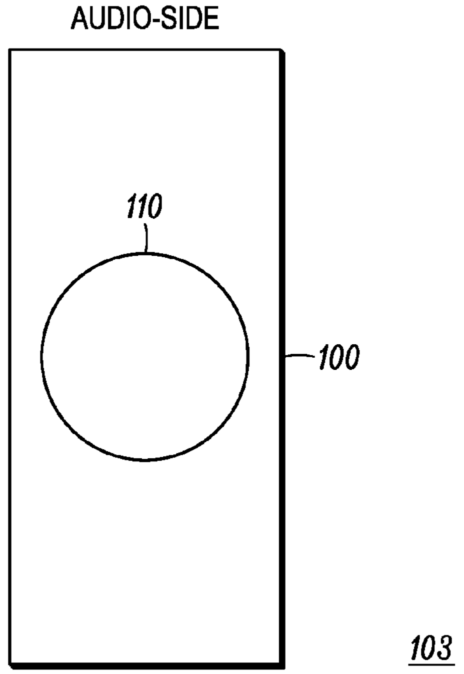
FIG. 3 is a back view of the dual-side radio of FIG. 1 showing the audio-side in accordance with an embodiment of the present invention.

Referring to FIG. 3, a back view 103 of the dual-sided radio 100 is shown. The back view is considered an audio-side 103 since it includes the primary transducer 110. The primary transducer 110 generates high-level sound when the radio is used in speakerphone mode. As illustrated in FIGS. 1-3, the primary transducer 110 and the secondary transducer 120 are on approximately opposite sides of the dual-sided radio. Notably, the primary transducer 110 projects sound in a first direction, and the secondary transducer 120 projects sound in a second direction that compensates for mid-high frequency loss of the primary sound in the second direction.

Figure 4:
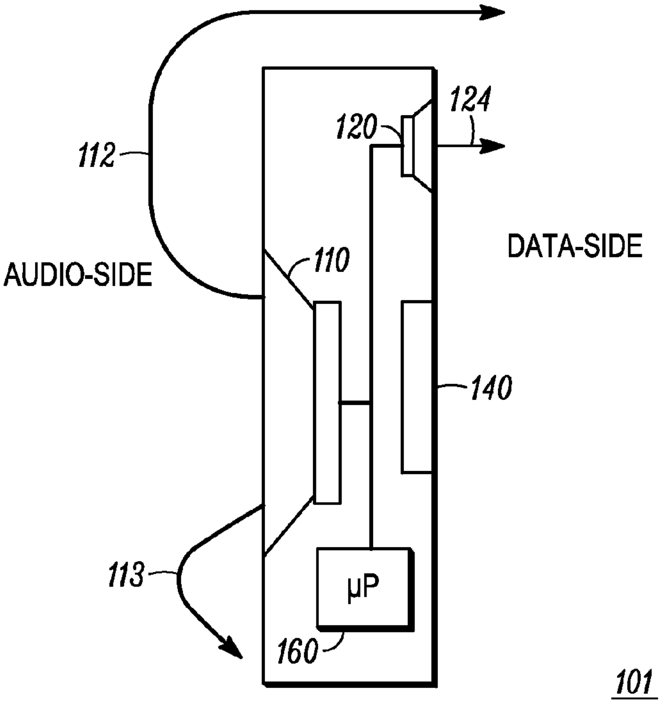
FIG. 4 is a side view of the dual-side radio of FIG. 1 showing sound propagation from the audio-side to the data-side in accordance with an embodiment of the present invention.

Referring to FIG. 4, the side view 101 of FIG. 1 illustrates the propagation of sound from the primary transducer 110 and the secondary transducer 120. In practice, a user uses the dual-sided radio 100 for dispatch two-way radio communication with the data-centric side 102 facing the user. In such regard, the user operates the dual-sided radio 100 in speaker phone mode. As an example, the user can hold the dual-sided radio 100 at arms length to engage in a voice conversation with another user. During speaker phone mode, high-level audio can be played out of the primary speaker 110.

As illustrated in FIG. 4, the primary speaker 110 projects sound away from the user when the display 140 of the dual-sided radio 100 faces the user. The majority of the energy of the sound produced by the primary transducer 110 is directed away and back from the user. However, much of the sound 112 still reaches the user by traveling around the dual-sided radio 100. This allows the user to operate the radio 100 in data-centric mode with the display 140 facing the user while still hearing sound from the audio-side of the radio 100. In certain configurations, the sound can also be ported through the phone internally to channel the sound to the data-side. However, much of the high-frequency sound is attenuated as a result of the orientation of the primary speaker 110 and the housing of the radio 100. In particular, the mid to high frequencies 113 of the sound produced by the primary transducer 110 may diffract off the radio 100.

In order to compensate for the mid to high frequency losses of the primary sound 112, the secondary transducer 120 provides a mid to high frequency sound 124 to compensate for the loss. In practice, the processor 160 receives audio from the communication module 130 (See FIG. 1). The processor directs audio to both the primary transducer 110 and the secondary transducer 120. The processor 160 can also selectively filter the audio prior to sending to the transducers. For example, the processor 160 can apply a high-pass filter to the audio before providing the audio to the secondary transducer. Notably, the audio is filtered in accordance with a frequency range specification of the secondary transducer. The frequency range may be a function of the transducer size. For example, the secondary transducer may be 1-2 cm in diameter with a frequency range between 2-5 KHz. In wideband audio, the secondary transducer 120 may support frequencies in the range of 4-8 KHz. The processor 160 may or may not process the audio to the primary transducer 110. For example, the primary transducer 110 may support the entire audio band 100 Hz to 3.6 Khz. Accordingly, the audio can be provided to the primary transducer with minimal filtering. In one configuration, the processor 160 can adjust an equalization of the audio to the primary transducer 110 and the secondary transducer 120.

Figure 5:
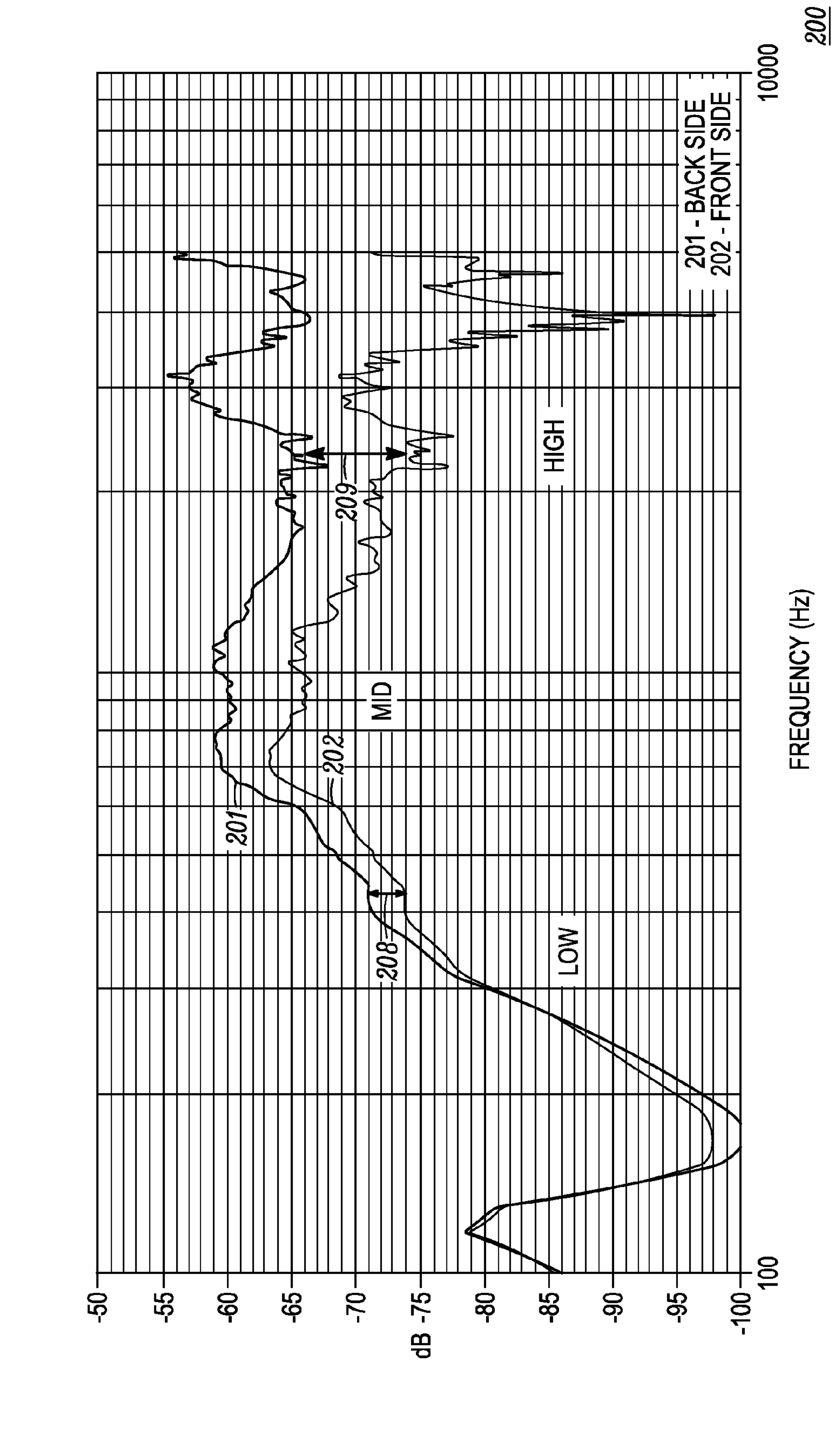
FIG. 5 is a frequency response of the dual-side radio of FIG. 1 as measured from the data-side and the audio-side in accordance with an embodiment of the present invention.

Referring to FIG. 5, an example of a frequency response plot 200 for the radio 100 is shown in accordance with some embodiments of the invention. Briefly, the frequency response plot 200 shows a first frequency response 201 of the radio 100 measured at the audio-side of the radio, and a second frequency response 202 measured at a data-side of the radio. Frequency response plot 201 is measured from the audio-side of the radio 100 and corresponds to a baseline frequency response as measured from the back of the radio (See FIG. 4). Frequency response plot 202 is measured from the data-side of the radio 100 and corresponds to a baseline frequency response as measured from the front of the radio (See FIG. 4). Notably, the difference in dB can be attributed to the direction of the primary transducer 110 when the sound is measured from the data-side or the audio-side.

The higher gain of the frequency response 201 in comparison to frequency response 202 is a result of the primary transducer 110 projecting sound directly to the measuring device. A difference between the frequency response 201 and frequency response 202 is also observed at higher frequencies. For example, the gain difference 208 in the lower frequencies is less that the gain difference 209 in the higher frequencies. A consequence of placing the primary transducer 110 on the audio-side of the radio is that, for a listener facing the display side of the radio, higher frequencies are attenuated more than lower frequencies. Briefly referring back to FIG. 4, the secondary transducer 120 generates a mid to high frequency sound that compensates for this mid to high frequency loss.

The dB difference between the frequency plot 201 and the frequency plot 202 do not differ in the same proportion across frequency. For example, a first difference 208 between plot 201 and plot 202 in the low frequency range is less than a second difference 209 between plot 201 and plot 202 in the high frequency range. The difference in dB is non-linearly related to a change in loudness. In fact, as an example, a 2 dB difference at a low frequency is not the same change in loudness as a 2 dB frequency at high frequencies. Experiments by the inventors have shown that the change in loudness of a sound measured from the primary transducer 110 at a data-side and the same sound measured at the audio-side is 7 phon, wherein phon is a measure of loudness. Accordingly, the sound emanating from the primary transducer 110 is louder at the data-side than at the audio-side.

Moreover, intelligibility is also a function of frequency. Thus a 2 dB difference at a low frequency is not the same change in intelligibility as a 2 dB difference at high frequencies. The frequency response plots 200 illustrate that high frequency loss is greater than low frequency loss. Accordingly, the intelligibility of the sound produced by the primary transducer 110 when evaluated from the data-side may be less than the intelligibility when evaluated from the audio-side. This can be a result of diffraction effects as the primary sound produced by the primary transducer 110 must travel around the radio 100 to reach the data-side. The diffraction effects can suppress high frequencies which contribute to intelligibility and clarity of the sound.

Figure 6:
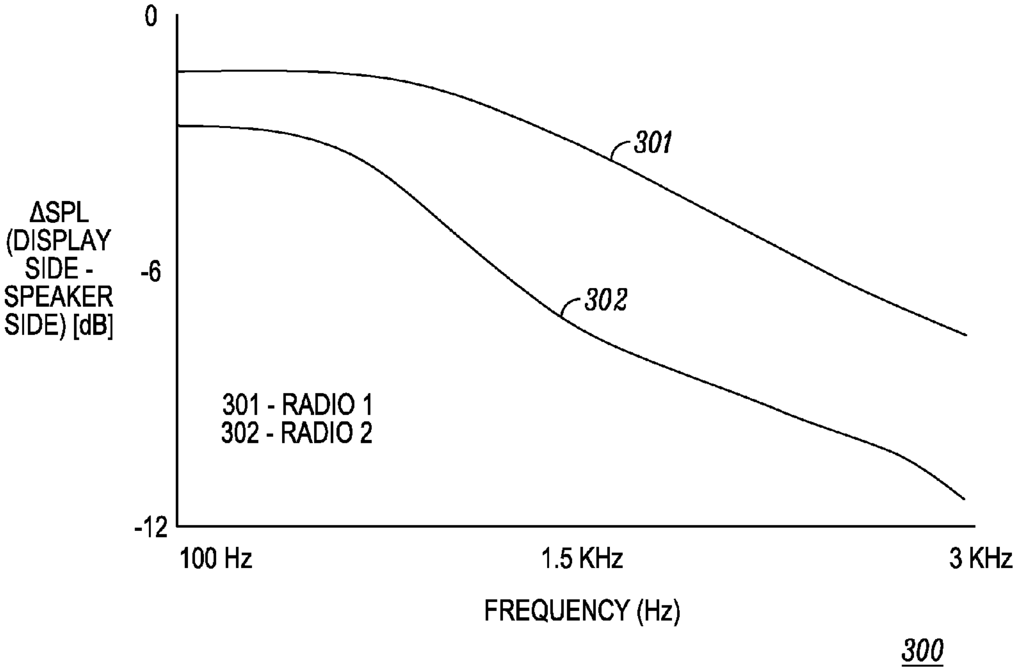
FIG. 6 is a diffraction effects plot for a small form factor radio and a large form factor radio in accordance with an embodiment of the present invention.

Referring to FIG. 6, an example diffraction plot 300 for two different sized radios are shown in accordance with some embodiments of the invention. Briefly, the diffraction plot 300 shows diffraction effects between two radios of different size. Also, the diffraction effect is more pronounced in a larger size radio having a larger form factor than a small size radio having a smaller form factor. The diffraction plot 300 shows the difference in decibels (dB) for a range of sound frequencies produced by a small form factor radio and a large form factor radio. Notably, the higher curve 301 has less of a diffraction effect, as seen by the smaller variance. The higher curve 301 corresponds to the smaller form factor radio. The lower curve 302, corresponding to the larger form factor radio, has a greater diffraction effect and shows more gain lost to diffraction. As illustrated, the smaller radio produces a diffraction plot 301 that is significantly higher than a diffraction plot 302 of the larger radio.

Consequently, referring back to FIG. 4, the higher frequencies of the sound produced by the primary speaker 110 are attenuated due to diffraction. Accordingly, the secondary transducer 120 on the front-side of the radio is provided to compensate for the higher frequency loss by projecting the missing mid-high frequency sounds. The secondary transducer 120 generates the higher frequencies of the sound produced by the primary speaker 110 that are lost to diffraction. Furthermore, the majority of the sound energy from the secondary transducer 120 travels away from the radio 100 in a direction towards the user thereby avoiding diffraction effects. The mid to high frequency sound produced by the secondary transducer 120 enhances the user's overall audio listening experience.

Figure 7:
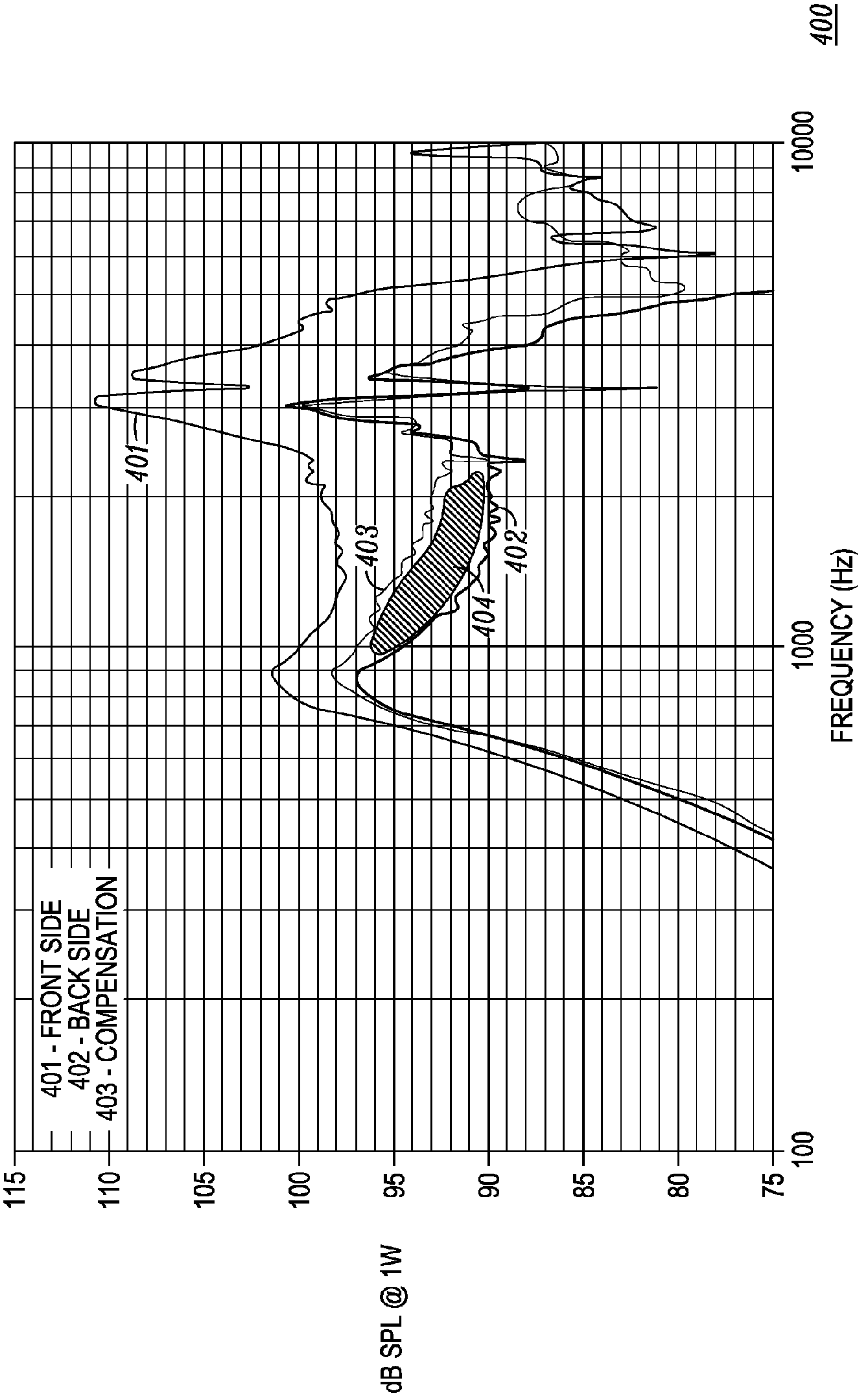
FIG. 7 is a compensated and equalized frequency response for the dual-side radio of FIG. 1 in accordance with an embodiment of the present invention.

Referring to FIG. 7, an example of a plot of frequency responses 400 for the radio 100 as measured from the different sides of the radio 100 is provided in accordance with some embodiments of the invention. Plot 401 is the frequency response for the radio 100 measured from the audio-side. Plot 402 is the frequency response for the radio having as measured from the data-side. Frequency plot 401 and 402 are captured only with the primary transducer 110 on. That is, the secondary transducer 120 is off and not contributing to the frequency responses 401 and 402. Plot 403 is the frequency response for the radio using the primary transducer 110 on the audio-side and the secondary transducer 120 on the data-side as the source of sound as measured from the data-side. That it, frequency responses 403 shows the contribution of the primary transducer 110 and the secondary transducer 120. The area 404 identifies the frequency gain on the data-side of the radio as a result of the mid to high frequencies generated by the secondary transducer 120. The secondary transducer 120 fills in a range of frequencies that are not diffracted in the sound produced by the primary transducer 110. In particular, the secondary transducer 120 fills in frequencies with the area 404. The resulting plot 403, is an equalized frequency response that compensates for mid to high frequency loss of the primary transducer due to diffraction.

Figure 8:
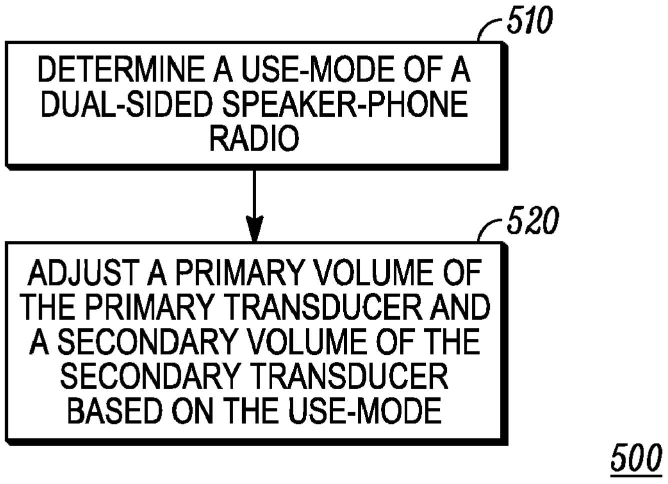
FIG. 8 is a method for dual-sided speaker porting in accordance with an embodiment of the present invention.

Referring to FIG. 8, a method 500 for dual-sided speaker porting is shown in accordance with an embodiment of the invention. The method can be practiced with more or less than the number of steps shown. To describe the method 500, reference will be made to FIG. 4 although it is understood that the method 500 can be implemented in any other suitable device or system using other suitable components. Moreover, the method 500 is not limited to the order in which the steps are listed in the method 500. In addition, the method 500 can contain a greater or a fewer number of steps than those shown in FIG. 4.

At step 510, a use-mode of a dual-sided speaker-phone radio can be determined. A use mode may be a whisper mode, or private mode, to provide discrete radio communication. For example, in whisper mode, the user does not want other users in a local vicinity to over hear a conversation. A user mode may also be a power saving mode to conserve battery power. As shown in FIG. 4, the dual-sided speaker-phone radio includes an audio side having a primary transducer for projecting primary sound in a first direction, a data-centric side having a secondary transducer for projecting mid-high frequency sound in a second direction, and a communication module operatively coupled to the primary transducer and the secondary transducer for receiving and transmitting communication signals containing audio. A user can select a use-mode by entering a request to enter a user mode. For example, the user can access a graphical user interface on the display 140 and select a use-mode. As another example, the radio 100 can automatically enter a use-mode based on radio resources. For example, the radio 100 may determine that the battery life is limited, and automatically enter power save mode.

At step 520, a primary volume of the primary transducer and a secondary volume of the secondary transducer can be adjusted based on the use-mode. For example, referring to FIG. 4, in whisper mode, the processor 160 can decrease a volume of the primary transducer 110 and increase a volume of the secondary transducer 120. Sound propagating from the back of the radio is effectively suppressed while sound propagating directly to the user is amplified. The processor 160 can also adjust the equalization between the primary transducer 110 and the secondary transducer in a balanced manner. That is, even though the overall volume has decreased, the equalization is maintained. From the user's perspective, the equalization of the sound is unchanged even though the volume has decreased for whisper mode, or power conserve mode.

Figure 9:
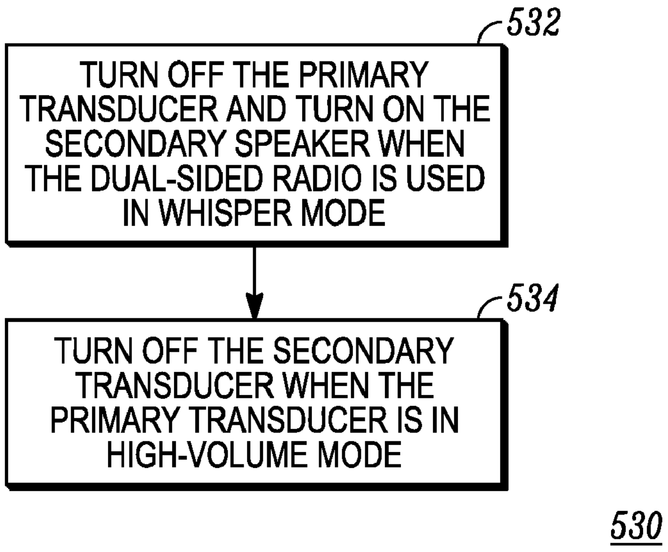
FIG. 9 provides method steps for dual-side porting based on user-mode in accordance with an embodiment of the present invention.

In one aspect, as shown in FIG. 9, the processor 160 can turn off the primary transducer 110 and turn on the secondary speaker 120 when the dual-sided radio is used in whisper mode (532). In such regard, only the secondary transducer 120 is used to deliver sound to the user. This prevents audio from being played out the high-audio primary transducer 110.

In another aspect, the processor 160 can turn off the secondary transducer 120 when the primary transducer 110 is in high-volume mode (534). For example, in a non-private mode, the user may decide to increase the volume of the radio to a maximum setting. The processor 160 can turn off the secondary transducer 120 since the volume of the primary transducer is sufficiently high, and which may mask the sound produced by the secondary transducer 120. That is, the processor 160 can turn off the secondary transducer 120 when the volume of the primary transducer 110 masks the benefit provided by the secondary transducer 120. This can also save power since audio is not delivered to the secondary transducer, or played out the secondary transducer 120.

Figure 10:
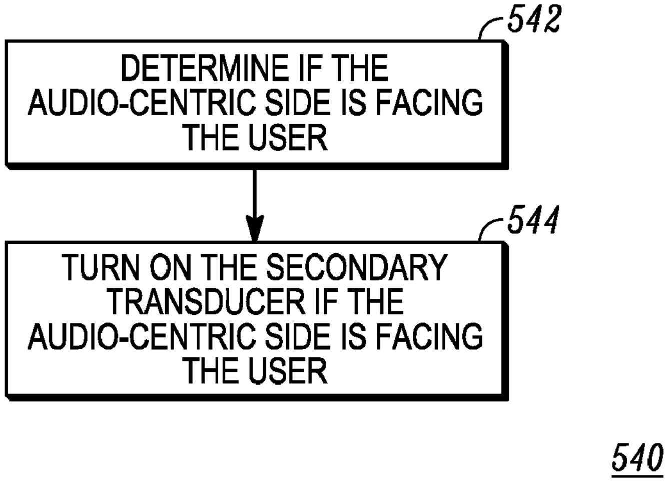
FIG. 10 provides method steps for dual-side porting based on radio orientation in accordance with an embodiment of the present invention.
Figure 11:
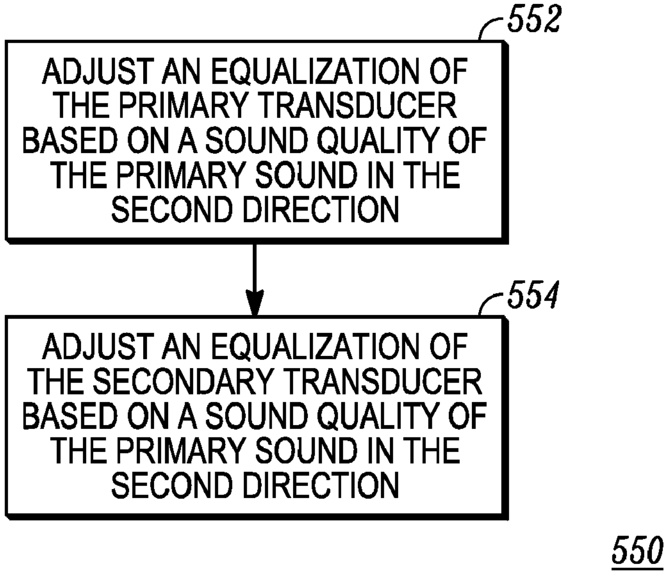
FIG. 11 provides method steps for adjusting an equalization in accordance with an embodiment of the present invention.

In another aspect, referring to FIG. 10, the processor 160 can determine whether the audio-centric side is facing the user (542). For example, the processor 160 can determine if a user is using the keypad 140 as shown in FIG. 4. The processor can then turn on the secondary transducer if the audio-centric side is facing the user (544). In yet another aspect, referring to FIG. 11, the processor 160 can adjust an equalization of the primary transducer based on a sound quality of the primary sound in the second direction (552). The processor 160 can also adjust an equalization of the secondary transducer based on a sound quality of the primary sound in the second direction (554). For example, referring back to FIG. 4, the processor 160 can provide the primary transducer 110 and the secondary transducer 120 with the same audio signal. The processor can apply high-pass filtering to the audio signal provided to the secondary transducer 120. In one arrangement, the high pass filter can be software controlled, such as a finite impulse response (FIR) filer. In another arrangement, the high-pass filter can be a physical resistive and capacitive circuit to adjust the frequency response.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

While the preferred embodiments of the invention have been illustrated and described, it will be clear that the embodiments of the invention is not so limited. Numerous modifications, changes, variations, substitutions and equivalents will occur to those skilled in the art without departing from the spirit and scope of the present embodiments of the invention as defined by the appended claims.

What is claimed is:

1. A dual-sided two-way radio comprising:

a housing having an audio-side and a data-side, the audio side and the data-side opposite each other and together providing simultaneous dispatch-audio;

a primary transducer on the audio-side of the two-way radio that projects a primary sound for dispatch two-way radio voice communication;

a secondary transducer on the data-side of the two-way radio that projects a mid-high frequency sound, and a communication module operatively coupled to the primary transducer and the secondary transducer that receives and transmits dispatch two-way communication signals containing audio, wherein the secondary transducer supplements the primary sound with a mid-high frequency sound to compensate for mid-high frequency loss of the primary sound due to diffraction thereby providing enhanced dispatch two-way voice communication intelligibility.

2. The dual-sided two-way radio of claim 1, wherein the primary transducer projects sound in a first direction, and the secondary transducer projects sound in a second direction that compensates for mid-high frequency loss of the primary sound in the second direction.

3. The dual-sided two-way radio of claim 1, wherein the primary transducer and the secondary transducer are on approximately opposite sides of the dual-sided two-way radio.

4. The dual-sided two-way radio of claim 1, wherein the secondary transducer is a mid-high frequency speaker that is significantly smaller than the primary transducer.

5. The dual-sided two-way radio of claim 1, further comprising a processor operatively coupled to the primary transducer and the secondary transducer that adjusts a primary volume of the primary transducer and adjusts a secondary volume of the secondary transducer when the dual-sided two-way radio is used in a whisper mode.

6. The dual-sided two-way radio of claim 5, further comprising a high-pass filter operatively coupled to the secondary transducer for filtering the audio.

7. The dual-sided two-way radio of claim 5, wherein the processor turns off the primary transducer and turns on the secondary transducer when the dual-sided two-way radio in response to a user request.

8. The dual-sided two-way radio of claim 1, further comprising:

a keypad operatively coupled to the communication module for entering data, and a display operatively coupled to the keypad for presenting visual information, wherein the secondary-transducer is peripheral to the key-pad or display.

9. A dual-sided speaker-phone radio comprising:

a housing having an audio-side and a data-centric side, the audio-side and the data-centric side opposite each other and together providing simultaneous dispatch-audio;

the audio-side having a primary transducer that projects a primary sound for dispatch voice communication in a first direction;

the data-centric side having a secondary transducer that projects mid-high frequency sound in a second direction;

a processor operatively coupled to the primary transducer and the secondary transducer that provides audio to the primary transducer and the secondary transducer; and a communication module operatively coupled to the processor that receives and transmits dispatch two-way communication signals containing the audio, wherein the secondary transducer compensates for mid-high frequency loss around the dual-sided speaker-phone radio due to diffraction from the primary transducer thereby providing enhanced dispatch two-way voice communication intelligibility during two-way radio communication.

10. The dual-sided speaker-phone radio of claim 9, wherein the audio-side is approximately opposite to the data-centric side.

11. The dual-sided speaker-phone radio of claim 9, wherein the data-centric side further comprises:

a key-pad operatively coupled to the communication module that receives user input data; and a display operatively coupled to the communication module and key-pad that presents visual information;

wherein the secondary transducer is peripheral to the display and the key-pad.

12. The dual-sided speaker-phone radio of claim 11, further comprising a processor that adjusts a primary volume of the primary transducer and a secondary volume of the secondary transducer based on a use-mode of the dual-sided speaker-phone radio.

13. The dual-sided speaker-phone radio of claim 12, wherein the processor turns off the secondary transducer when high-volume audio is projected out the primary transducer.

14. The dual-sided speaker-phone radio of claim 12, wherein the processor turns on the secondary transducer when the data-centric side is used.

15. A method for dual-sided speaker porting, the method comprising:

determining a use-mode of a dual-sided speaker-phone radio, by a processor of the dual-sided speaker-phone radio, having:

a housing having an audio side and a data-centric side, the audio side and the data-centric side opposite each other and together providing simultaneous dispatch-audio;

the audio side having a primary transducer for projecting primary sound for dispatch two-way voice communication in a first direction;

the data-centric side having a secondary transducer for projecting mid-high frequency sound for dispatch two-way voice communication in a second direction, the secondary transducer supplementing the primary sound with the mid-high frequency sound to compensate for mid-high frequency loss of the primary sound due to diffraction; and adjusting, by the processor, a primary volume of the primary transducer and a secondary volume of the secondary transducer based on the use-mode thereby providing enhanced dispatch two-way voice communication intelligibility when the speaker-phone radio is held away from a user's ear.

16. The method of claim 15, further comprising:

turning off the primary transducer and turning on the secondary transducer when the dual-sided radio is used in whisper mode.

17. The method of claim 15, further comprising:

turning off the secondary transducer when the primary transducer is in high-volume mode.

18. The method of claim 15, further comprising:

determining whether the audio-centric side is facing the user; and turning on the secondary transducer if the audio-centric side is facing the user.

19. The method of claim 15, further comprising:

adjusting an equalization of the primary transducer based on a sound quality of the primary sound in the second direction.

20. The method of claim 19, further comprising:

adjusting an equalization of the secondary transducer based on a sound quality of the primary sound in the second direction.

21. A portable two-way radio, comprising:

first and second audio transducers coupled to first and second opposing sides of the two-way portable radio, the first and second audio transducers together providing simultaneous dispatch-audio; and the first transducer projecting primary audio for dispatch two-way voice communication, and the secondary transducer projecting mid-high frequency audio for automatically supplementing the primary audio for mid-high frequency loss in the primary audio due to diffraction in response to a use-mode of the portable two-way radio thereby providing enhanced dispatch two-way voice communication intelligibility when the portable two-way radio is held away from a user's ear.

22. The dual-sided radio of claim 1, wherein the primary transducer has a frequency range of 100 Hz to 3.6 KHz, and the secondary transducer has a frequency range of 2-5 KHz.

23. The dual-sided speaker-phone radio of claim 9, wherein the primary transducer has a frequency range of 100 Hz to 3.6 KHz, and the secondary transducer has a frequency range of 2-5 KHz.

24. The method of claim 15, wherein the primary transducer has a frequency range of 100 Hz to 3.6 KHz, and the secondary transducer has a frequency range of 2-5 KHz.

25. The portable radio of claim 21, wherein the first audio transducer has a frequency range of 100 Hz to 3.6 KHz, and the second audio transducer has a frequency range of 2-5 KHz.

26. The dual-sided two-way radio of claim 1, wherein the dual-sided two-way radio is held away from a user's ear during dispatch two-way voice communication.

27. The dual-sided speaker-phone radio of claim 9, wherein the dual-sided speaker-phone is held away from a user's ear during dispatch two-way voice communication.

* * * * *

UNITED STATES PATENT AND TRADEMARK OFFICE

CERTIFICATE OF CORRECTION

PATENT NO. : 8,320,585 B2
APPLICATION NO. : 11/672630
DATED : November 27, 2012
INVENTOR(S) : Gruenhagen et al.

It is certified that error appears in the above-identified patent and that said Letters Patent is hereby corrected as shown below:

On the Title Page, Item (57), under "ABSTRACT", in Column 2, Line 10, delete "(404)" and insert -- (124) --, therefor.

In the Specifications:

In Column 8, Line 17, delete "keypad 140" and insert -- keypad 150 --, therefor.

In the Claims:

In Column 11, Line 12, in Claim 22, delete "radio" and insert -- two-way radio --, therefor.

In Column 12, Line 4, in Claim 25, delete "radio" and insert -- two-way radio --, therefor.

Signed and Sealed this
Twenty-third Day of April, 2013

Teresa Stanek Rea
*Acting Director of the United States Patent and Trademark Office*